United States Patent [19]
Cabot

[11] Patent Number: 5,089,981
[45] Date of Patent: Feb. 18, 1992

[54] HYBRID FORM DIGITAL FILTER

[75] Inventor: Richard C. Cabot, Portland, Oreg.

[73] Assignee: Audio Precision, Inc., Portland, Oreg.

[21] Appl. No.: 342,011

[22] Filed: Apr. 24, 1989

[51] Int. Cl.$^5$ .............................................. G06F 15/31
[52] U.S. Cl. ............................ 364/724.17; 364/724.16
[58] Field of Search ........................ 364/724.16, 724.17

[56] References Cited

U.S. PATENT DOCUMENTS

| | | |
|---|---|---|
| 3,522,546 | 8/1970 | Jackson . |
| 3,609,568 | 9/1971 | Jackson . |
| 3,619,586 | 11/1971 | Hoff, Jr. et al. . |
| 3,749,895 | 7/1973 | Kao . |
| 3,777,130 | 12/1973 | Croisser et al. . |
| 3,906,199 | 9/1975 | Kieburtz et al. . |
| 3,965,338 | 6/1976 | Van Gerwen et al. ......... 364/724.01 |
| 4,317,092 | 2/1982 | Potter .......................... 364/724.16 |
| 4,488,251 | 12/1984 | Wischermann . |
| 4,521,867 | 6/1985 | Kasuga ......................... 364/724.17 |
| 4,539,536 | 9/1985 | White ........................... 364/724.16 |
| 4,751,663 | 6/1988 | Yamazaki ..................... 364/724.01 |
| 4,811,263 | 3/1989 | Hedley et al. ................. 364/724.17 |

OTHER PUBLICATIONS

Roberts et al., *Digital Signal Processing* Addison-Wesley, 1987, pp. 72-74 & 396-398.

*Primary Examiner*—David H. Malzahn
*Attorney, Agent, or Firm*—William A. Birdwell

[57] ABSTRACT

A hybrid form digital filter. A digital filter is provided wherein the zeros of its transfer function are provided by a direct form digital filter portion and the poles of the transfer function are provided by a normal form digital filter portion. The hybrid filter provides truncation noise and stability characteristics like those of a normal form digital filter, but its filter coefficients may be calculated more rapidly than those for a normal form digital filter having the same transfer function, thereby enabling the coefficients to be calculated in real time for tuning the filter. While the preferred embodiment is a second order hybrid digital filter, the same principles are applicable to higher order digital filters as well.

12 Claims, 5 Drawing Sheets

HYBRID FORM DIGITAL FILTER

BACKGROUND OF THE INVENTION

This invention relates to digital filters, particularly to tunable digital filters having low noise characteristics for use in digital signal processing.

There are several particularly important factors that affect the design of tunable digital filters for digital signal processing. First, it is important to minimize the introduction of truncation noise, sometimes also called "round-off" noise. This kind of noise is introduced as a result of truncating the least significant digits of a digital word in order to fit the word within an available register. Second, the filter must not experience limit cycles as a result of overflow errors, i.e., it must not oscillate. Third, in order for the filter to be practical as a tunable filter, the filter coefficients must be rapidly calculable. Prior art digital filters of second or higher order have lacked this combination of features.

One commonly known topology for a digital filter is the "direct form" filter. In this topology, the coefficients of the filter structure are exactly the same as the coefficients of the z-domain transfer function. The coefficients of the direct form filter are relatively easy to calculate, but the filter suffers from significant introduction of truncation noise, particularly at low frequencies. In addition, the direct form digital filter can experience limit cycles unless special care is taken to avoid the conditions that cause overflow errors. A description of the direct form filter can be found in R. Roberts and C. Mullis, *Digital Signal Processing* (Addison-Wesley, 1987). pp. 72–74. TK 5102.5R525.

Another previously known digital filter topology is the "normal form" filter. In this topology, instead of acting directly on the input signal, the filter acts on state variables derived from the input signal, and the filter structure corresponds to a state space model of the filter. Although the normal form filter provides much better low-frequency noise characteristics than the direct form filter and cannot experience limit cycles, its coefficients are difficult and time-consuming to calculate. In addition, the normal form filter coefficients can exceed 2 in value, which makes implementation of the filter in fixed-point digital signal processing hardware difficult by requiring scaling operations. A description of the normal form filter can be found in *Digital Signal Processing, id* at pp 396–98.

Accordingly, it can be seen that there has been a need for a digital filter topology that produces less truncation noise, cannot experience limit cycles due to overflow errors, and permits rapid computation of the filter coefficients so that the filter can be tuned in real time.

SUMMARY OF THE INVENTION

The present invention provides a hybrid form of digital filter that employs features of both the normal form topology and the direct form topology to minimize truncation noise, prevent limit cycles from occurring and enable the hybrid filter coefficients to be calculated rapidly enough to tune the filter in real time. It has been discovered that, by proper selection of certain of the coefficients of a normal form filter, the zeros of the normal form transfer function can be eliminated and replaced by the corresponding portion of a direct form filter. The zeros of the transfer function of the hybrid filter of the present invention may be provided a portion of a direct form topology, and the poles may be provided by a portion of a normal form topology. This provides the low noise and stability characteristics of a normal form filter while significantly reducing the difficulty of computing the filter coefficients, thereby enabling those coefficients to be computed in real time.

The foregoing and other objectives, features, and advantages of the invention will be more readily understood upon consideration of the following detailed description of the invention, taken in conjunction with the accompanying drawings.

DETAILED DESCRIPTION OF THE INVENTION

It is customary to describe the input-output characteristics of a digital filter as a ratio of polynomials in the following form:

$$H(z) = \frac{a_0 + a_1 z^{-1} + a_2 z^{-2} + \ldots + a_n z^{-n}}{1 + b_1 z^{-1} + b_2 z^{-2} + \ldots + b_n z^{-n}}$$

where $H(z)$ = the filter transfer function in the z domain,
$z = e^{j2\pi f/T}$, which represents a complex discrete-time variable for time delay T and frequency f,
$n$ = the order of the filter,
$a_0$–$a_n$ = numerator transfer function coefficients, and
$b_0$–$b_n$ = denominator transfer function coefficients.

Thence, $$Y(z) = H(z) U(z)$$

where $U(z)$ = the input signal in the z domain, corresponding to u(t), the input signal in the time domain, and
$Y(z)$ = the output signal in the z domain, corresponding to y(t), the output signal in the time domain.

The roots of the numerator of the transfer function comprise its zeros, and the roots of the denominator of the transfer function comprise its poles. However, the filter transfer function does not necessarily describe the topology of the filter, as many different topologies can ordinarily be conceived that will provide the same transfer function. On the other hand, the topology of the digital filter determines the noise characteristics of the filter, the filter's stability, and the ease with which the filter coefficients (as distinguished from the transfer function coefficients) can be computed.

Figure 1:
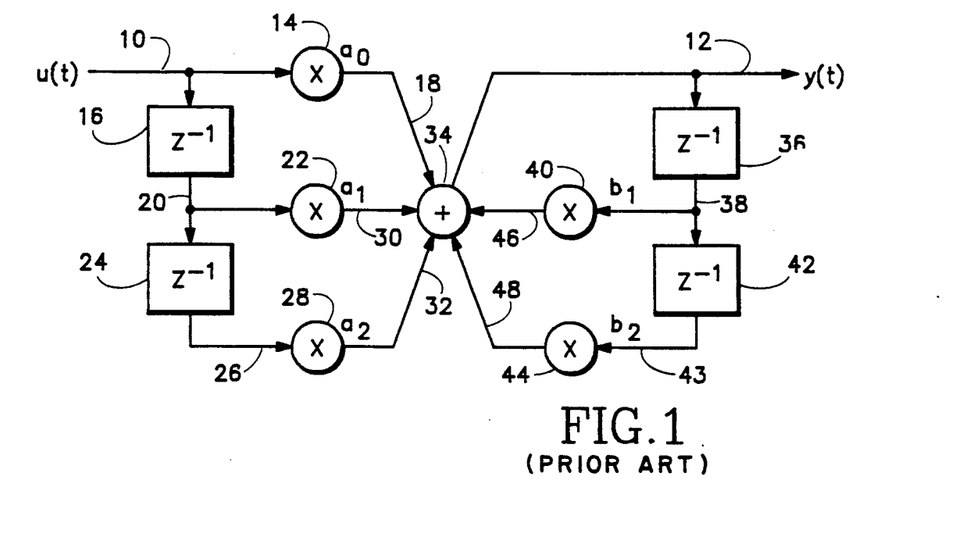
FIG. 1 show a block diagram of a prior art second order direct form digital filter

A prior art direct form filter is illustrated by the second order filter shown in FIG. 1. In that filter, a signal u(t) to be filtered is applied at signal input 10, and a filtered signal y(t) appears at signal output 12. The input signal u(t) comprises a sequence of digital words, which ordinarily represent discrete samples of a continuous analog signal. The output signal y(t) likewise comprises a sequence of digital words. To obtain an analog signal from the output signal, it must be applied to a digital-to-analog converter, as is commonly known in the art.

The input signal u(t) is applied to a first multiplier 14 and a first unit time delay ("unit delay") 16. The first multiplier 14 multiplies the signal u(t) by the coefficient $a_0$ and produces at output 18 the product $a_0 u(t)$ Indeed, in each of the figures referred to in this Description it is to be understood that the signal applied to a multiplier is multiplied by the coefficient shown beside the multiplier to produce an output which is the product of the applied signal and the coefficient. The first unit delay 16 delays the signal u(t) by the time delay T and produces at its output 20 the delayed signal. As in the case of the multipliers, in each of the figures it is to be understood that a unit delay causes the signal applied to it to be produced as an output of the unit delay after a time delay T.

The output 20 of the unit delay 16 is applied to a second multiplier 22. It is also applied to a second unit delay 24, thereby delaying the signal u(t) by an additional time period T. The output 26 of unit delay 24 is applied to a third multiplier 28. The output 18 of the first multiplier, the output 30 of the second multiplier, and the output 32 of the third multiplier are applied to the input of an accumulator, or summing junction, 34. The portion of the direct form filter corresponding to multipliers 14, 22 and 28 and unit delays 20 and 24 is hereinafter referred to as the input portion.

Output signal y(t) of the filter is produced at the output 12 of the accumulator 34, which is also the output of the filter. The output 12 produces a signal which is the sum of multiplier outputs 18, 30 and 32, as well as feedback signals hereafter described. Output 12 is applied to a third unit delay 36, whose output 38 is applied to a fourth multiplier 40 and a fourth unit delay 42. The output 43 of unit delay 42 is applied to a fifth multiplier 44. The output 46 of multiplier 40 and the output 48 of multiplier 44 are applied as the aforementioned feedback inputs to the accumulator 34.

In the direct form digital filter, the structure of the filter corresponds to the form of the filter transfer function. Thus, the coefficients of the feed forward multipliers of the filter of FIG. 1, i.e., multipliers 14, 22 and 28, are the same as the numerator coefficients of the filter transfer function, and the coefficients of the feedback multipliers of the filter, i.e., multipliers 40 and 44, are the same as the denominator coefficients of the filter transfer function. Consequently, the filter coefficients are relatively easy to calculate.

Truncation noise is caused in digital filters because, when the input signal to a multiplier is multiplied by the multiplier coefficient, the product has a word length in excess of the signal word length and must eventually be truncated to the signal word length. This eliminates information about the product, which introduces noise. For example, the unit delays 36 and 42, and the corresponding multipliers 40 and 44, of the feedback paths in the filter of FIG. 1 are ordinarily only 16 bits long. When a 16-bit signal word is multiplied by a 16-bit coefficient, the product may be 32 bits long. However, the output from the accumulator 34 must be truncated to 16 bits for input to the feedback paths, which introduces error.

In the direct form filter shown in FIG. 1, the truncation error is amplified as the result of the presence of feedback paths, producing noise gain. Indeed, such filters suffer from significant noise gain at low frequencies because, at low frequencies, the non-feedback input to the accumulator must be greatly attenuated to maintain the same filter gain as at higher frequencies. Thence, the signal at the output 12 represents the sum of the relatively small non-feedback signals and the relatively large feedback signals applied to the accumulator 34. The relatively small difference between those signals is discarded when the accumulator output 12 is truncated to the length of the input signal, which produces noise.

In general, the noise at the output of a direct form second order bandpass filter is proportional to the following product:

$$\left(\frac{S.R.}{C.F.}\right)\left(\frac{S.R.}{B.W.}\right)$$

where
- S.R. = sampling rate, i.e., the rate at which the digital words representing the input signal u(t) occur,
- C.F. = the center frequency of the filter, and
- B.W. = the bandwidth of the filter.

For example, a typical bandpass filter having a bandwidth of 5 Hz and a center frequency of 20 Hz in a digital signal processing system having a sampling rate of 48000 Hz has a noise gain of about 100 dB, which uses all of the dynamic range of a 16-bit processor.

In addition, a direct form filter of the type shown in FIG. 1 may experience limit cycles when overdriven, due to the limited arithmetic precision. When overload occurs, the output signal will be in error and this error is fed back into the accumulator by the action of the two output delays and multipliers. This error signal is of a polarity which causes the filter to have positive feedback and oscillate.

Figure 2:
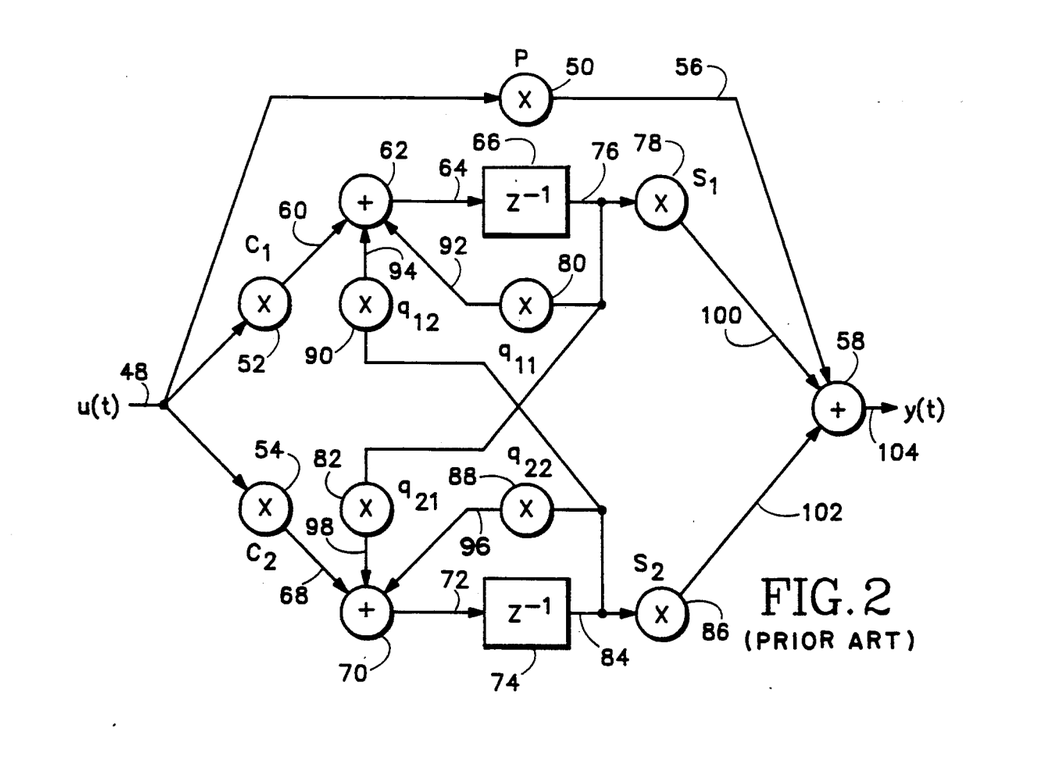
FIG. 2 shows a block diagram of a prior art second order normal form digital filter.

In the second order normal form filter shown in FIG. 2, the input signal u(t) is applied via signal input 48 to multiplier 50, multiplier 52 and multiplier 54. The output 56 of multiplier 50 is applied to an output accumulator 58. The output 60 of multiplier 52 is applied to an accumulator 62, whose output 64 is, in turn, applied to a unit delay 66. The output 68 of multiplier 54 is applied to accumulator 70, whose output 72 is, in turn, applied to unit delay 74. The output 76 of unit delay 66 is applied to multiplier 78, multiplier 80 and multiplier 82. The output 84 of unit delay 74 is applied to multiplier 86, multiplier 88 and multiplier 90. The output 100 of multiplier 78 and the output 102 of multiplier 86 are applied to accumulator 58, and are there added to multiplier output 56 to produce the filter signal output 104, represented by signal y(t).

The output 92 of multiplier 80 and the output 94 of multiplier 90 are applied to the accumulator 62. Thence, the accumulator output 64 is the sum of a weighted input signal 60, a weighted feedback signal 92 from unit delay 66 and a weighted cross-over feedback signal 94 from unit delay 74. The output 96 of multiplier 88 and the output 98 of multiplier 82 are applied to accumulator 70. Thus, the accumulator output 72 is the sum of a weighted input signal 68, a weighted feedback signal 96 from unit delay 74, and a weighted cross-over feedback signal 98 from unit delay 66. This cross-over feedback topology reduces the noise gain of the normal form filter and prevents limit cycles. More specifically, for a second order normal form bandpass filter, the noise gain is only proportional to the ratio (S.F.)/(C.F.), and is not dependent on the filter bandwidth.

The transfer function for a second order normal form digital filter shown in FIG. 2 is:

$$H(z) = p + \frac{k_1 z^{-1} + k_2 z^{-2}}{1 + m_1 z^{-1} + m_2 z^{-2}} =$$

$$\frac{p + (pm_1 + k_1)z^{-1} + (pm_2 + k_2)z^{-2}}{1 + m_1 z^{-1} + m_2 z^{-2}}$$

where $p$ = the coefficient of multiplier 50,
$q_{11} = q_{22} = -m_1/2$ = the coefficients of multipliers 80 and 88,
$q_{12} = x(1+k_2)k^2_1$ = the coefficient of multiplier 90,
$q_{21} = x/(1+k_2)$ = the coefficient of multiplier 82,
$c_1 = (1+k_2)/2$ = the coefficient of multiplier 52,
$c_2 = k_1/2$ = the coefficient of multiplier 54,
$s_1 = k_1/(1+k_2)$ = the coefficient of multiplier 78,
$s_2 = 1$ = the coefficient of multiplier 86, and
$x = (k_2 - m_1 k_1/2) + \{k^2_2 - k_1 k_2 m_1 + k^2_1 m_2\}^{1/2}$, and or $x = (k_2 - m_1 k_1/2) - \{k^2_2 - k_1 k_2 m_1 + k^2_1 m_2\}^{1/2}$, one form of the equation for $x$ being used for $q_{12}$ and the other form being used for $q_{21}$.

It can be seen that, while the noise and stability characteristics of the normal form filter are much better than those for the direct form filter, the calculation of its coefficients is complex. As a practical matter, it is inordinately time-consuming for real-time tuning of the filter.

Figure 3:
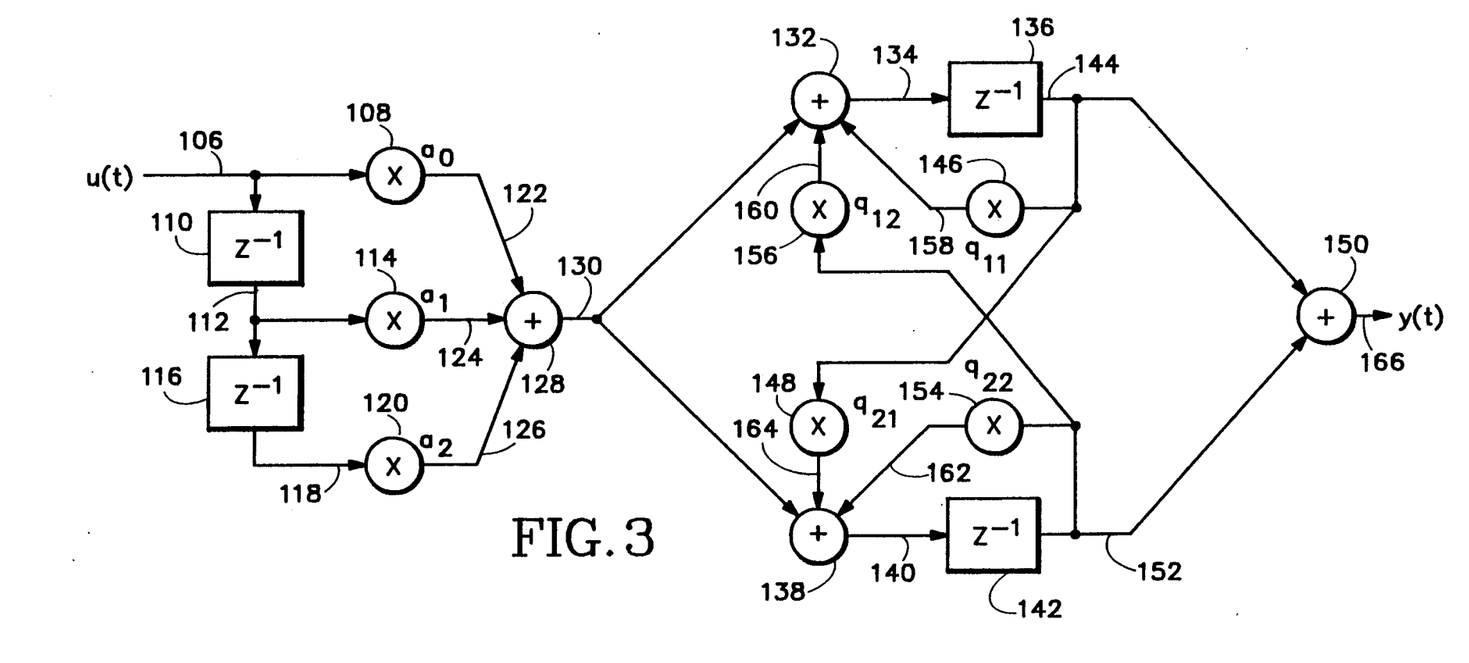
FIG. 3 shows a block diagram of a preferred embodiment of a second order hybrid form digital filter according to the present invention.

Turning now to FIG. 3, the preferred embodiment of the present invention shown therein is a hybrid form filter which employs the feedback portion of a normal form filter and the input portion of a direct form filter. It has been found that, by setting the coefficients $p=0$, $k_1=1$ and $k_2=0$, computation of the normal form filter coefficients is simplified. In the normal form filter shown in FIG. 2, the coefficients now become $$q_{11} = q_{22} = -\frac{m_1}{2}$$

$$c_1 = c_2 = 1/2$$

$$s_1 = s_2 = 1$$

$$q_{12} = x_1 = -\frac{m_1}{2} + m_2^{1/2}$$

$$q_{21} = x_2 = -\frac{m_1}{2} - m_2^{1/2}$$

If $R^2$ is substituted for $m_2$ and $-2R \cos \theta$ for $m_1$, then
$q_{11} = q_{22} = R \cos \theta$
$q_{12} = R(1 + \cos \theta)$
$q_{21} = R(\cos \theta - 1)$,
where R is the radial distance of the pole from the origin in the z plane and $\theta$ is the angle of the pole. The angle $\theta$ corresponds to the frequency of the pole, while the value of R corresponds to the sharpness of the pole.

Since $p=0$, multiplier 50 can be eliminated. Since $S_1 = S_2 = 1$, multipliers 78 and 86 can be eliminated. Since $C_1 = C_2 = \frac{1}{2}$, multipliers 52 and 54 can be eliminated and the input amplitude can be scaled by $\frac{1}{2}$ to maintain the correct output amplitude. Although the filter coefficients $q_{11}$, $q_{22}$, $q_{12}$ and $q_{21}$ must still be calculated, this is considerably simplified by the elimination of the numerator terms in the normal form filter equation.

Concomitantly, the zeros of the filter transfer function are eliminated, and the calculation of the filter coefficients corresponding to the denominator of the transfer function is greatly simplified. At the same time, it has been found that the zeros of the transfer function can be provided by the input portion of a direct form filter, whose coefficients are easily calculated.

In the preferred embodiment shown in FIG. 3, the signal u(t) to be filtered is applied to signal input 106, and thereby to multiplier 108 and unit delay 110. The signal output 112 of unit delay 110 is applied to multiplier 114 and to unit delay 116. The output 118 of unit delay 116 is applied to multiplier 120. The output 122 of multiplier 108, the output 124 of multiplier 114, and the output 126 of multiplier 120 are applied to an accumulator 128, where they are summed to produce an accumulator output 130. Accordingly, the signal at output 130 represents the input signal u(t) operated on by the numerator portion of the filter transfer function, whose roots represent the zeros of the transfer function. That is, the output 30 is the result of the following operation:

$$\text{output } 130 = U(z)(a_0 = a_1 z^{-1} + a_2 z^{-2})$$

The accumulator output 130 is applied to an accumulator 132, whose output 134 is applied to a unit delay 136. The accumulator output 130 is also applied to an accumulator 138, whose output 140 is applied to a unit delay 142. The output 144 of unit delay 136 is applied to multiplier 146, to multiplier 148 and to output accumulator 150. The output 152 of the unit delay 142 is applied to multiplier 154, to multiplier 156 and to the output accumulator 150. The output 158 of multiplier 146 and the output 160 of multiplier 156 are applied as feedback and cross feedback, respectively, to the accumulator 132 so as to be summed with the output 130 to produce the accumulator output 134. The output 162 of multiplier 154 and the output 164 of multiplier 148 are applied as feedback and cross feedback, respectively, to accumulator 138 so as to produce accumulator output 140. The unit delay outputs 144 and 152 are summed at output accumulator 150 to produce the filter output 166, represented by signal y(t).

Accordingly, the signal at output 166 represents the signal at output 130 operated on by the denominator portion of the filter transfer function, whose roots are the poles of the transfer function. That is, the output at 166 is the result of the following operation:

$$\text{output } 166 = (\text{output } 130) \frac{1}{1 + m_1 z^{-1} + m_2 z^{-2}}$$

Together the two portions of the hybrid filter perform the following operation:

$$Y(z) = U(z) \frac{a_0 + a_1 z^{-1} + a_2 z^{-2}}{1 + m_1 z^{-1} + m_2 z^{-2}}$$

Figure 4:
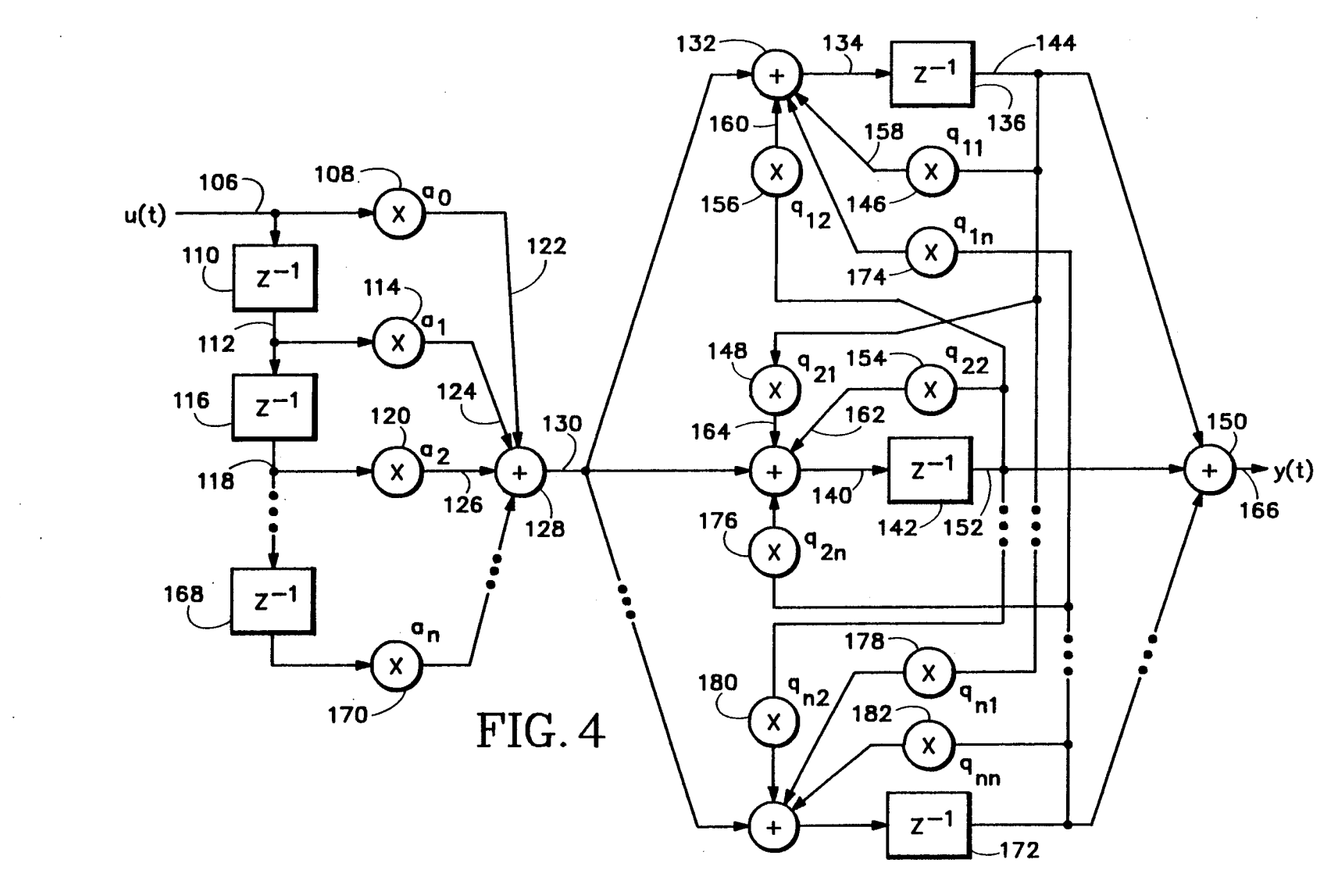
FIG. 4 shows a block diagram of an embodiment of an $n^{th}$ order hybrid form digital filter according to the present invention.

The principles of the present invention can be extended to higher order filters, as illustrated by FIG. 4.

In that example additional unit delays and multipliers have been added, up to the $n^{th}$ set of such elements for an $n^{th}$ order filter. That is, unit delay 168 and multiplier 170 represent the $n^{th}$ unit delay and multiplier, respectively, in the input portion of the filter. Similarly, unit delay 172 and multipliers 174, 176, 178, 180 and 182 represent the $n^{th}$ unit delay and corresponding set of multipliers that must be added to the feedback portion of the filter. It is to be recognized, however, that each unit delay requires weighted feedback from every other unit delay as well as itself, so that the number of multipliers increases geometrically with increasing filter order.

Figure 5:
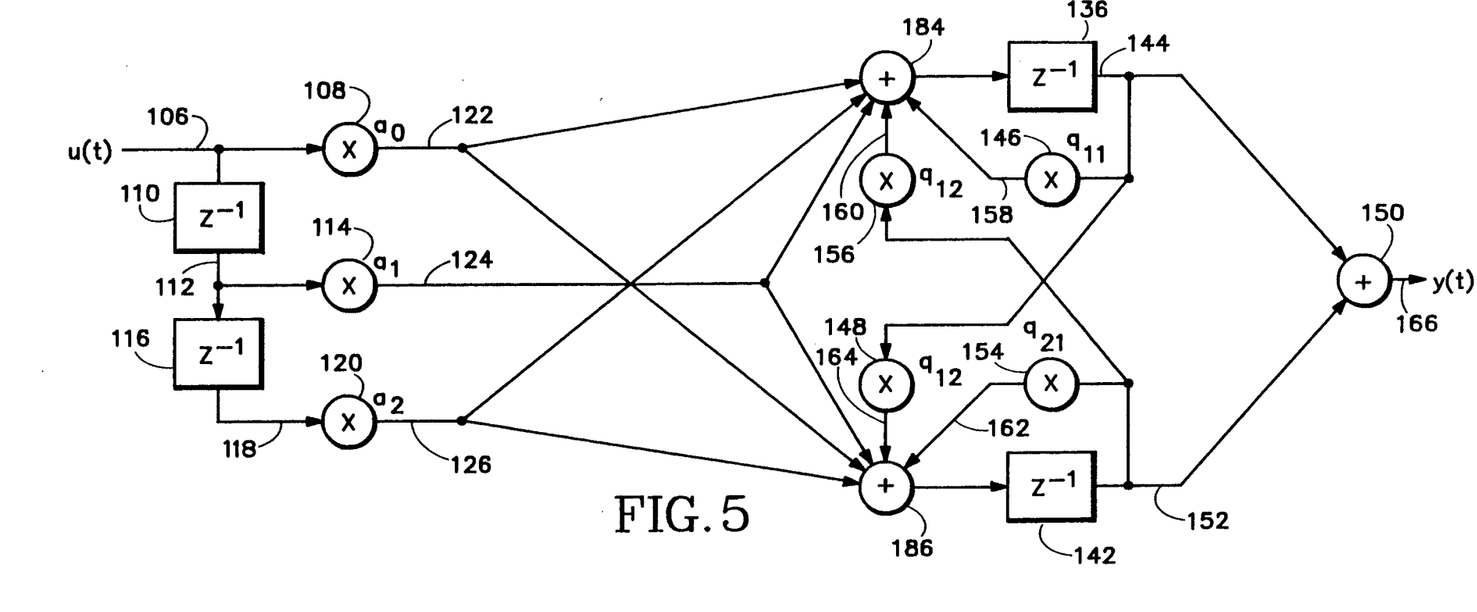
FIG. 5 shows a block diagram of a first alternative embodiment of a second order hybrid form digital filter according to the present invention.

A first alternative embodiment of the invention is shown in FIG. 5. In that embodiment the multiplier outputs 122, 124 and 126 in the input portion of the filter are applied to two separate accumulators 184 and 186 which also receive the multiplier outputs 158 and 160, and multiplier outputs 162 and 164, respectively, in the feedback section of the filter. Simple inspection reveals that the result will be the same as for the embodiment shown in FIG. 3.

Figure 6:
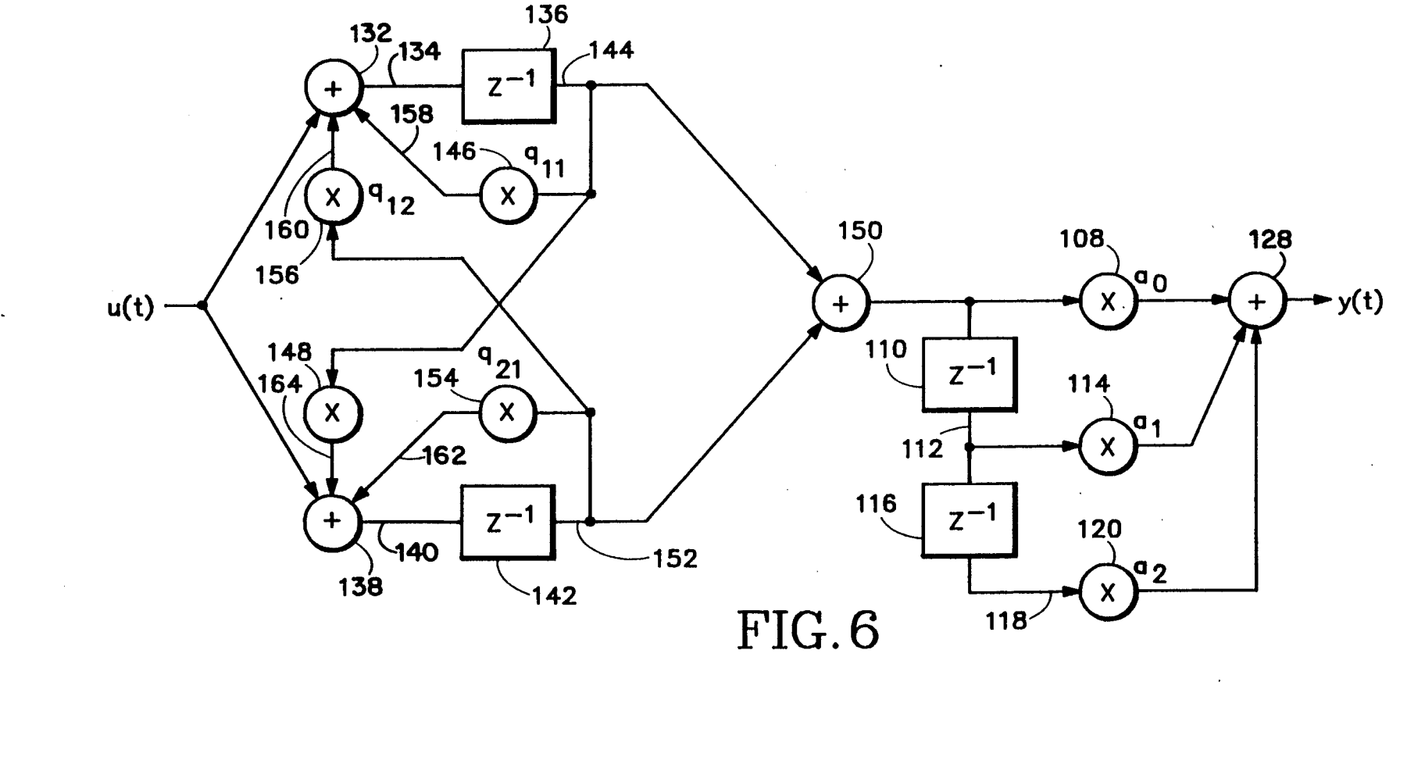
FIG. 6 shows a block diagram of a second alternative embodiment of a second order hybrid form digital filter according to the present invention.

A second alternative embodiment of the invention is shown in FIG. 6. In that embodiment the order of the input and feedback portions of the hybrid filter shown in FIG. 3 filter is reversed. That is, the portion of the filter providing the poles comes first and the portion of the filter providing the zeros comes second. However, the effect on the output of the filter is the same as for the embodiment shown in FIG. 3.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A digital filter combination having a filter combination signal input, a filter signal output, and a filter combination transfer function represented by a numerator polynomial divided by a denominator polynomial, the roots of the numerator polynomial comprising the zeros of the filter combination transfer functions and the roots of the denominator polynomial comprising the poles of the filter combination transfer function, said filter combination comprising:

(a) direct form filter whose transfer function corresponds to said numerator of said filter combination transfer function, said direct form filter having a signal input and a signal output;
   (b) a normal form filter whose transfer function corresponds to said denominator of said filter combination transfer function, said normal form filter having a signal input and a signal output; and
   (c) means for applying said signal output of said direct form filter to said signal input of said normal form filter, said signal input of said direct form filter and said signal output of said normal form filter comprising said filter combination signal input and signal output, respectively.

2. The digital filter combination of claim 1, wherein said filter is a second order filter having the following transfer function:

$$H_0(z) = \frac{a_0 + a_1 z^{-1} + a_2 z^{-2}}{1 + m_1 z^{-1} + m_2 z^{-2}},$$

said direct form filter has the following transfer function:

$$H_1(z) = a_0 + a_1 z + a_2 z^{-2}$$

and said normal form filter has the following transfer function:

$$H_2(z) = \frac{1}{1 + m_1 z^{-1} + m_2 z^{-2}},$$

where the normal form parameters are found as follows:

$$q_{11} = q_{22} = -\frac{m_1}{2}$$

$$q_{12} = -\frac{m_1}{2} + m_2^{1/2}$$

$$q_{21} = -\frac{m_1}{2} - m_2^{1/2}$$

$c_1 = \frac{1}{2}$
$c_2 = \frac{1}{2}$
$s_1 = 1$
$s_2 = 1$
$p = 0$ so that the normal form transfer function $H_2(z)$ contains no zeros.

3. The filter combination of claim 1, wherein said direct form filter comprises first multiplier means responsive to said filter combination signal input, first unit delay means responsive to said filter combination signal input, second multiplier means responsive to said first unit delay means, second unit delay means responsive to said first unit delay means, third multiplier means responsive to said second unit delay means, and first summing means responsive to said first, second and third multiplier means, and said normal form filter comprises second summing means responsive to said first summing means, third unit delay means responsive to said second summing means, fourth multiplier means responsive to said third unit delay means and having an output applied through said second summing means to said third unit delay means, third summing means responsive to said first summing means, fourth unit delay means responsive to said third summing means, fifth multiplier means responsive to said fourth unit delay means and having an output applied through said third summing means to said fourth unit delay means, sixth multiplier means responsive to said third unit delay means and having an output applied through said third summing means to said fourth unit delay means, seventh multiplier means responsive to said fourth unit delay means an having an output applied through said second summing means to said third unit delay means, and fourth summing means responsive to said third unit delay means and said fourth unit delay means for providing said filter combination signal output.

4. The filter combination of claim 1, wherein said direct form filter comprises first multiplier means responsive to said filter combination signal input, first unit delay means responsive to said filter combination signal input, second multiplier means responsive to said first unit delay means, second unit delay means responsive to said first unit delay means, third multiplier means responsive to said second unit delay means, and first summing means responsive to said first, second and third multiplier means, and said normal form filter comprises fourth multiplier means responsive to said first summing means, second summing means responsive to said fourth multiplier means, third unit delay means responsive to said second summing means, fifth multiplier means responsive to said third unit delay means and having an output applied through said second summing means to said third unit delay means and having an output applied though said second summing means to said third unit delay means, sixth multiplier means responsive to said first summing means, third summing means responsive to said sixth multiplier means, fourth unit delay means responsive to said third summing means, seventh multiplier means responsive to said fourth unit delay means and having an output applied through said third summing means to said fourth unit delay means, eighth multiplier means responsive to said third unit delay means and having an output applied through said third summing means to said fourth unit delay means, ninth multiplier means responsive to said fourth unit delay means and having an output applied through said second summing means to said third unit delay means, tenth multiplier means responsive to said third unit delay means, eleventh multiplier means responsive to said fourth unit delay means, and fourth summing means responsive to said tenth multiplier means and said eleventh multiplier means for providing said filter combination signal output.

5. A method of filtering a digital signal, comprising:
(a) providing a digital filter combination having a transfer function represented by a numerator polynomial divided by a denominator polynomial, the roots of said numerator polynomial comprising the zeros of the transfer function of said filter combination and the roots of said denominator polynomial comprising the poles of the transfer function of said filter combination, said zeros being provided by a direct form filter having an input and an output and said poles being provided by a normal form filter having an input and an output;
(b) applying said digital signal as an input to said direct form filter; and
(c) applying the output of said direct form filter as an input to said normal form filter, the output of said normal form filter comprising a filtered derivative of said digital signal.

6. The method of claim 5, wherein said digital filter combination is a second order filter having the following transfer function:

$$H_0(z) + \frac{a_0 + a_1 z^{-1} + a_2 z^{-2}}{1 + m_1 z^{-1} + m_2 z^{-2}},$$

said direct form filter has the following transfer function:

$$H_1(z) = a_0 + a_1 z^{-1} + a_2 z^{-2},$$

and said normal form filter has the following transfer function:

$$H_2(z) = \frac{1}{1 + m_1 z^{-1} + m_2 z^{-2}},$$

where the normal form filter parameters are found as follows:

$$q_{11} = q_{22} = -\frac{m_1}{2}$$

$$q_{12} = -\frac{m_1}{2} + m_2^{1/2}$$

$$q_{21} = -\frac{m_1}{2} - m_2^{1/2}$$

$c_1 = \frac{1}{2}$
$c_2 = \frac{1}{2}$
$s_1 = 1$
$s_2 = 1$
$p = 0$ so that the normal form transfer function $H_2(z)$ contains no zeros.

7. The method of claim 5, wherein said digital filter combination is a second order filter having the following transfer function:

$$H_0(z) + \frac{a_0 + a_1 z^{-1} + a_2 z^{-2}}{1 + m_1 z^{-1} + m_2 z^{-2}},$$

said normal form filter has the following transfer function:

$$H_2(z) = \frac{1}{1 + m_1 z^{-1} + m_2 z^{-2}},$$

and said direct form filter has the following transfer function:

$$H_1(z) = a_0 + a_1 z^{-1} + a_2 z^{-2},$$

where the normal form parameters are found as follows:

$$q_{11} = q_{22} = -\frac{m_1}{2}$$

$$q_{12} = -\frac{m_1}{2} + m_2^{1/2}$$

$$q_{21} = -\frac{m_1}{2} - m_2^{1/2}$$

$c_1 = \frac{1}{2}$
$c_2 = \frac{1}{2}$
$s_1 = 1$
$s_2 = 1$
$p = 0$ so that the normal form transfer function $H_2(z)$ contains no zeros.

8. A digital filter combination having a filter combination signal input, a filter combination signal output, and a filter combination transfer function represented by a numerator polynomial divided by a denominator polynomial, the roots of the numerator polynomial comprising the zeros of the filter combination transfer function and the roots of the denominator polynomial comprising the poles of the filter combination transfer function, said filter combination comprising:

(a) a normal form filter whose transfer function corresponds to said denominator of said filter combination transfer function, said direct form filter having a signal input and a signal output; and (b) a direct form filter whose transfer function corresponds to said numerator of said filter combination transfer function, said direct form filter having a signal input and a signal output; and (c) means for applying said signal output of said normal form filter to said signal input of said director form filter, said signal input of said normal form filter and said signal output of said direct form filter comprising said filter combination signal input and said filter combination signal output, respectively.

9. The digital filter combination of claim 8, wherein said filter combination is a second order filter having the following transfer function:

$$H_0(z) + \frac{a_0 + a_1 z^{-1} + a_2 z^{-2}}{1 + m_1 z^{-1} + m_2 z^{-2}},$$

said normal form filter has the following transfer function:

$$H_2(z) = \frac{1}{1 + m_1 z^{-1} + m_2 z^{-2}},$$

and said direct form filter has the following transfer function:

$$H_1(z) = a_0 + a_1 z^{-1} + a_2 z^{-2},$$

where the normal form filter parameters are found as follows:

$$q_{11} = q_{22} = -\frac{m_1}{2}$$

$$q_{12} = -\frac{m_1}{2} + m_2^{1/2}$$

$$q_{21} = -\frac{m_1}{2} - m_2^{1/2}$$

so that the normal form filter transfer function $H_2(z)$ contains no zeros.

10. The digital filter combination of claim 8, wherein said normal form filter comprises first summing means responsive to said filter combination signal input, first unit delay means responsive to said first summing means, first multiplier means responsive to said first unit delay means and having an output applied through said first summing means to said first unit delay means, second summing means responsive to said filter combination input, second unit delay means responsive to said second summing means, second multiplier means responsive to said second unit delay means and having an output applied through said second summing means to said second unit delay means, third multiplier means responsive to said first unit delay means and having an output applied through said second summing means to said second unit delay means, fourth multiplier means responsive to said second unit delay means and having an output applied through said first summing means to said first unit delay means, and third summing means responsive to said first unit delay means and said second unit delay means, and said direct form filter comprises fifth multiplier means responsive to said third summing means, third unit delay means responsive to said third summing means, sixth multiplier means responsive to said third unit delay means, fourth unit delay means responsive to said third unit delay means, seventh multiplier responsive to said fourth unit delay means, and fourth summing means responsive to said fifth, sixth and seventh multiplier means for providing said filter combination signal output.

11. The digital filter combination of claim 8, wherein said normal form filter comprises first multiplier means responsive to said filter combination signal input, first summing means responsive to said first multiplier means, first unit delay means responsive to said first summing means, second multiplier means responsive to said first unit delay means and having an output applied through said first summing means to said first unit delay means, third multiplier means responsive to said filter combination signal input, second summing means responsive to said third multiplier mans, second unit delay means responsive to said second summing means, fourth multiplier means responsive to said second unit delay means and having an output applied through said second summing means to said second unit delay means, fifth multiplier means responsive to said fist unit delay means and having an output applied through said second summing means to said second unit delay means, sixth multiplier means responsive to said second unit delay means and having an output applied through said first summing means to said first unit delay means, seventh multiplier means responsive to said first unit delay means, eighth multiplier means responsive to said second unit delay means, and third summing means responsive to said seventh multiplier means and said eighth multiplier means, and said direct form filter comprises ninth multiplier means responsive to said third summing means, third unit delay means responsive to said third summing means, tenth multiplier means responsive to said third unit delay means, fourth unit delay means responsive to said third unit delay means, eleventh multiplier means responsive to said fourth unit delay means, and fourth summing means responsive to said ninth, tenth and eleventh multiplier means for providing said filter combination signal output.

12. A method of filtering a digital signal, comprising:
(a) providing a digital filter combination having a filter combination transfer function represented by a numerator polynomial divided by a denominator polynomial, the roots of said numerator polynomial comprising the zeros of the said filter combination transfer function and the roots of said denominator polynomial comprising the poles of said filter combination transfer function, said poles being provided by a normal for filter having an input and an output, and said zeros being provided by a direct form filter having an input and an output;

(b) applying said digital signal as an input to said normal form filter; and (c) applying the output of said normal form filter as an input to said direct form filter, the output of said direct form filter comprising a filtered derivative of said digital signal.

* * * * *